United States Patent [19]

Abe

[11] Patent Number: 5,317,191

[45] Date of Patent: May 31, 1994

[54] LOW-MELTING-POINT JUNCTION MATERIAL HAVING HIGH-MELTING-POINT PARTICLES UNIFORMLY DISPERSED THEREIN

[75] Inventor: Shunichi Abe, Itami, Japan

[73] Assignee: Mitsubishi Denki Kabushiki Kaisha, Tokyo, Japan

[21] Appl. No.: 929,443

[22] Filed: Aug. 14, 1992

[30] Foreign Application Priority Data

Aug. 19, 1991 [JP] Japan ................... 3-206776

[51] Int. Cl.$^5$ ............ H01L 23/48; H01L 29/46; H01L 29/62; H01L 29/64
[52] U.S. Cl. ................... 257/746; 257/772; 257/782; 257/783; 257/741
[58] Field of Search ............ 357/67; 257/772, 779, 257/782, 783, 741, 746; 228/563, 248, 123

[56] References Cited

U.S. PATENT DOCUMENTS

| | | | |
|---|---|---|---|
| 2,735,050 | 2/1956 | Armstrong | 317/235 |
| 3,199,004 | 8/1965 | Dickson, Jr. | 317/240 |
| 4,097,266 | 6/1978 | Takahashi et al. | 357/67 |
| 4,480,261 | 10/1984 | Hattori et al. | 357/71 |
| 4,651,191 | 3/1987 | Ooue et al. | 357/67 |
| 4,740,252 | 4/1988 | Hasegawa et al. | 148/24 |
| 4,847,675 | 7/1989 | Eng | 357/67 |
| 4,865,654 | 9/1989 | McLellan | 148/24 |

FOREIGN PATENT DOCUMENTS

| | | | |
|---|---|---|---|
| 56-14069 | 2/1981 | Japan | 228/123 |
| 1046934 | 5/1989 | Japan | 228/248 |
| 2281742 | 11/1990 | Japan | 257/772 |
| 318041 | 1/1991 | Japan | 257/772 |
| 4270092 | 9/1992 | Japan | . |

*Primary Examiner*—Andrew J. James
*Assistant Examiner*—T. M. Arroyo
*Attorney, Agent, or Firm*—Leydig, Voit & Mayer

[57] ABSTRACT

A semiconductor device includes a semiconductor element attached to a support member by a junction material that includes a parent phase of a low-melting-point junction material and fine particles of a high-melting-point junction material which are uniformly dispersed in the low-melting-point material. By heating the junction material to a temperature higher than the melting point of the low-melting-point junction material and lower than the melting point of the high-melting-point junction material, the low-melting-point junction material is brought to a molten state, making the entire junction material fluid. Thus, the size of the junction material need not be adjusted to that of the semiconductor element. Further, with this semiconductor device, the contact area between the low-melting-point junction material and the high-melting-point junction material is extremely large so that the requisite time for making the composition of the junction material uniform is shortened.

3 Claims, 3 Drawing Sheets

LOW-MELTING-POINT JUNCTION MATERIAL HAVING HIGH-MELTING-POINT PARTICLES UNIFORMLY DISPERSED THEREIN

BACKGROUND OF THE INVENTION

1. Field of the Invention

This invention relates to a semiconductor device and, in particular, to a semiconductor device having a junction material portion consisting of a parent phase of a low-melting-point junction material and fine particles of a high-melting-point junction material which are uniformly dispersed therein.

2. Description of the Related Art

FIG. 5 is a schematic longitudinal sectional view showing part of a conventional semiconductor device, and FIG. 6 is a perspective view of the junction material portion of the semiconductor device shown in FIG. 5. In these drawings, a semiconductor element 1 is attached to a die pad 3 through a junction material 4, which is, for example, a three-layer structure consisting of a high-melting-point solder layer 4b and low-melting-point solder layers 4a respectively provided on opposite surfaces thereof.

In this semiconductor device, constructed as described above, the semiconductor element 1 is attached to the die pad as follows: First, the junction material 4 is cut up in the same size as the semiconductor element 1 and is placed between the semiconductor element 1 and the die pad 3. Then, the junction material 4 is heated to and kept at a temperature higher than the melting point of the low-melting-point solder 4a and lower than that of the high-melting-point solder 4b, whereby the low-melting-point solder 4a is brought to a molten state, attaching the semiconductor element 1 to the die pad 3. Further, as a result of keeping the junction material at such a temperature, a mutual dispersion occurs between the low-melting-point and high-melting-point solder components 4a and 4b, with the result that they are eventually formed into a single junction material having a uniform composition. The melting point of this junction material thus formed is higher than that of the low-melting-point solder 4a and lower than that of the high-melting-point solder 4b. This melting point can be controlled by varying the compositions and volumes of the low-melting-point and high-melting-point solder components 4a and 4b before melting. In this way, the semiconductor element 1 can eventually be attached to the die pad 3 by means of a single-phase junction material.

Afterwards, the electrode terminals of the semiconductor device 1 and the tips of inner leads (not shown) are connected to each other through fine metal wires by a wire bonding technique such as thermocompression or ultrasonic bonding. Subsequently, the device is subjected to the steps of molding, lead cutting, lead bending, electrical parameter check, etc. before the production thereof is completed.

A problem with the semiconductor device described above is that if the semiconductor device 1 is to be attached to the die pad 3 with the low-melting-point solder 4a wetting the entire back surface of the semiconductor element 1, it is necessary for the junction material 4 to have the same size as the semiconductor device 1, which means each time the size of the associated semiconductor device 1 is changed, the size of the junction material 4 must be changed accordingly. Further, in the conventional junction material 4, the interface between the high-melting-point and low-melting-point solders 4b and 4a is a plane, so that the area utilized for the mutual dispersion is relatively small. Accordingly, the above-mentioned heat treatment must be performed for a long period of time before the junction material attains a desired composition through mutual dispersion.

SUMMARY OF THE INVENTION

This invention has been made with a view to solving these problems. It is accordingly an object of this invention to provide a semiconductor device in which the heat treatment time for making the composition of the junction material uniform is shortened and which uses a junction material whose size need not be adjusted to that of the associated semiconductor element.

In order to achieve the above object, there is provided a semiconductor device comprising:

a semiconductor element;

a support member; and a junction material disposed between the semiconductor element and the support member attaching the semiconductor element to the support member wherein;

the junction material includes a parent phase of a low-melting-point junction material and fine particles of a high-melting-point junction material uniformly dispersed in the parent phase.

DESCRIPTION OF THE PREFERRED EMBODIMENT

Figure 1:
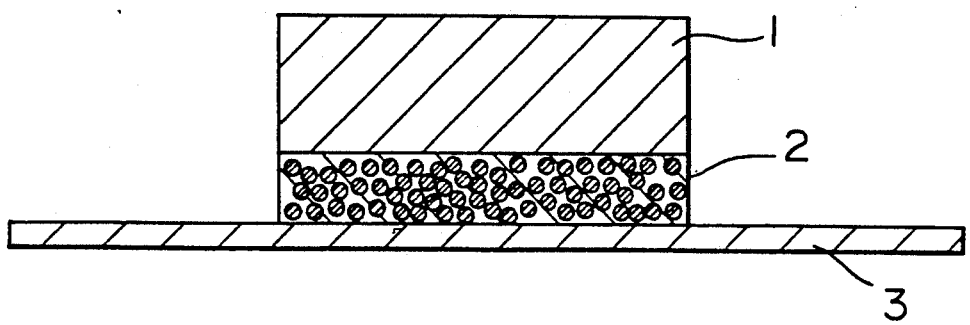
FIG. 1 is a schematic side sectional view showing a semiconductor device in accordance with an embodiment of this invention.
Figure 2:
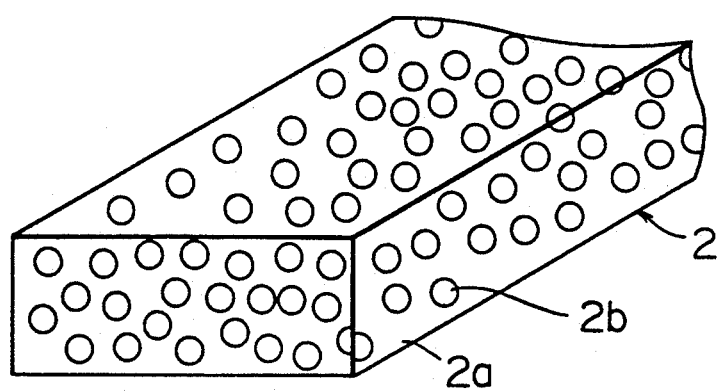
FIG. 2 is an enlarged perspective view showing the junction material of the semiconductor device shown in FIG. 1.

FIG. 1 is a schematic side sectional view showing a semiconductor device in accordance with an embodiment of this invention. In the accompanying drawings, the same or equivalent components are referred to by the same reference numerals. In FIG. 1, a semiconductor element 1 is attached to a support member, for example, a die pad 3, by means of a junction material 2. FIG. 2 is an enlarged perspective view of the junction material 2, which includes a low-melting-point solder 2a as a parent phase and fine particles of a high-melting-point solder 2b uniformly dispersed in the parent phase. The low-melting-point solder 2a preferably consists of an eutectic solder of Pb-60Sn, and the high-melting-point solder 2b preferably consists of Pb.

Figure 3:
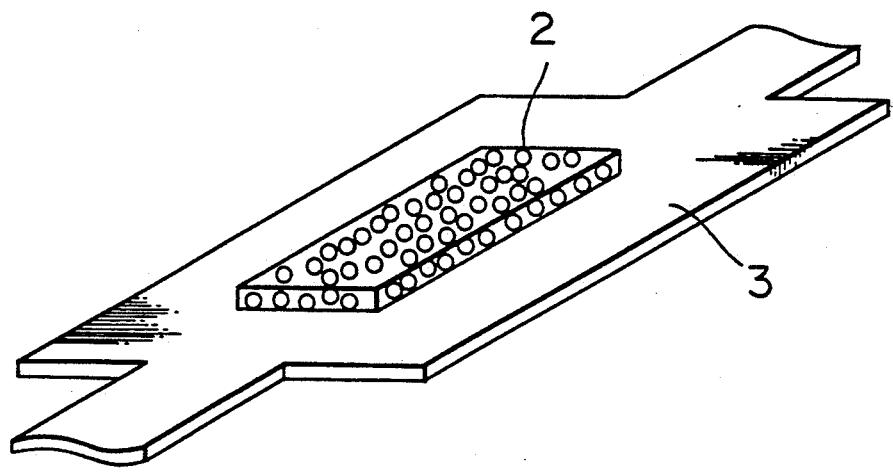
FIG. 3 is a perspective view of the junction material placed on a die pad.
Figure 4:
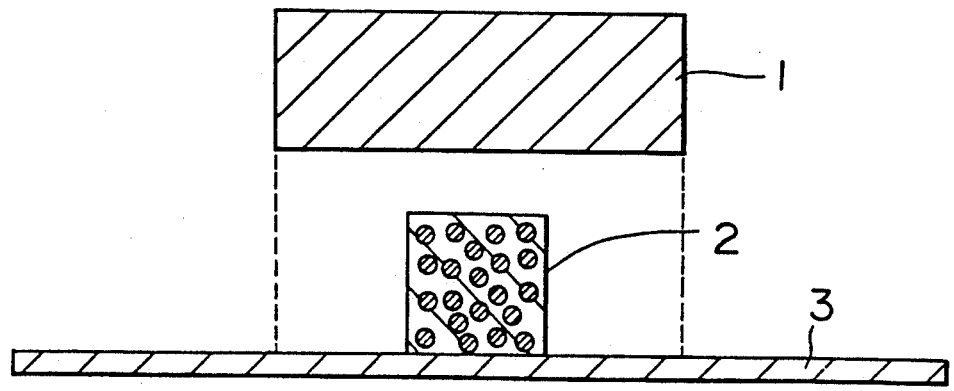
FIG. 4 is a schematic side sectional view in which the junction material has not yet been pressed against the die pad by the semiconductor element.
Figure 5:
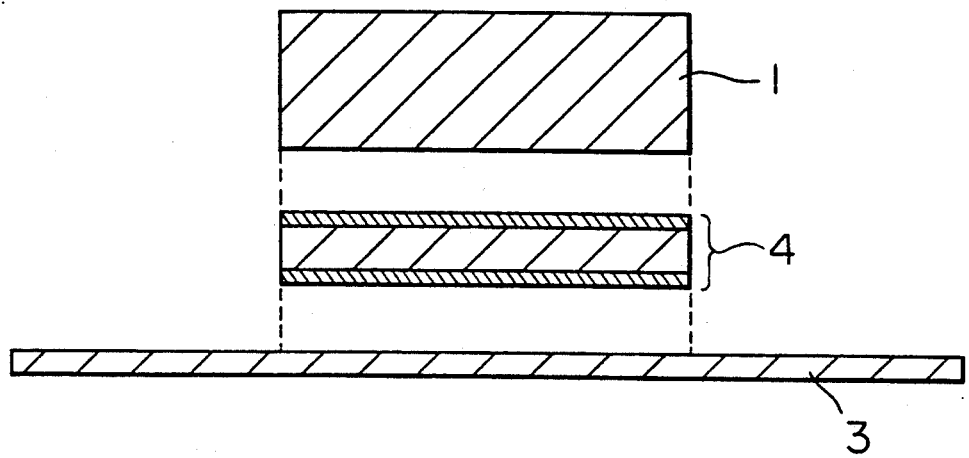
FIG. 5 is a schematic side sectional view of a conventional semiconductor device in which the semiconductor element has not yet been attached to the die pad.
Figure 6:
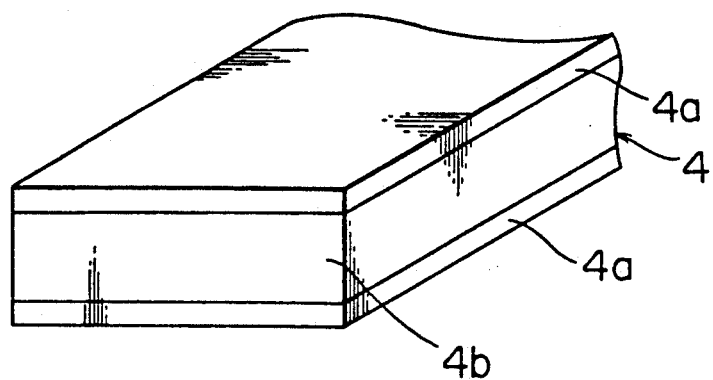
FIG. 6 is an enlarged perspective view showing the junction material of the semiconductor device shown in FIG. 5.

With this semiconductor device, constructed as described above, the junction material 2 is first cut up into a predetermined size and, as shown in FIG. 3, placed on the die pad 3 formed, for example, of a Cu alloy. By heating this junction material 2 to a temperature higher than the melting point of Pb-60Sn and lower than that of Pb and keeping it at this temperature, the Pb-60Sn is brought to a molten state. When, in this condition, the semiconductor element 1 is pressed against the junction material 2, as shown schematically in FIG. 4, the junction material 2 wets the semiconductor element 1 and the die pad 3, with the Pb being dispersed uniformly. The resulting condition is shown in FIG. 1. Since the junction material 2 is thus spread, there is no need to adjust its size to that of the semiconductor element 1, thus making it possible for a junction material 2 of a fixed size to be applied to semiconductor elements 1 of different sizes.

If the junction material 2 is kept at the above temperature longer, the Sn in the Pb-60Sn, which is in the molten state, is gradually dispersed into the Pb. Since the area of the interface between the Pb-60Sn and the Pb is extremely large, the dispersion takes place rapidly, with the result that the junction material attains a uniform composition in a short time, attaching the semiconductor element 1 to the die pad 3.

While in the above embodiment Pb-60Sn is used as the low-melting-point solder 2a, the same effect can be obtained by using In, etc. While in the above embodiment Pb is used as the high-melting-point solder 2b, it is also possible to use Pb-5Sn, etc. Further, while in the above embodiment a Cu alloy is used as the material of the die pad 3, the same effect can be obtained by using an Fe alloy, etc.

The mixing ratio of the low-melting-point solder 2a to the high-melting-point solder 2b may be determined such that the uniform composition of the junction material 2 exhibits when it has been completely melted corresponds to a predetermined composition. The particle configuration of the high-melting-point solder 2b is not particularly limited since the junction material 2 can spread uniformly.

As described above, in accordance with this invention, the time for the heat treatment for making the composition of the junction material uniform is shortened and, at the same time, there is no need to adjust the size of the junction material to that of the associated semiconductor element, thus making it possible to produce a semiconductor device efficiently.

What is claimed is:

1. A semiconductor device comprising
   a semiconductor element;
   a support member; and
   a junction material disposed between said semiconductor element and said support member for attaching said semiconductor element to said support member wherein said junction material includes a parent phase of Pb-60Sn having a relatively low melting point and fine particles of Pb having a relatively high melting point uniformly dispersed in the parent phase.

2. The semiconductor device as claimed in claim 1 wherein said support member is a die pad.

3. A semiconductor device comprising:
   a semiconductor element;
   a support member; and
   a junction material disposed between said semiconductor element and said support member for attaching said semiconductor element to said support member wherein said junction material includes a parent phase of In having a relatively low melting point and fine particles of Pb-5Sn having a relatively high melting point uniformly dispersed in the parent phase.

* * * * *